United States Patent [19]

Rough et al.

[11] Patent Number: 4,887,005
[45] Date of Patent: Dec. 12, 1989

[54] MULTIPLE ELECTRODE PLASMA REACTOR POWER DISTRIBUTION SYSTEM

[76] Inventors: J. Kirkwood H. Rough, 264 S. 14th St., San Jose, Calif. 95112; Peter W. Rose, 1000 Almanor Ave., Menlo Park, Calif. 94025

[21] Appl. No.: 97,592

[22] Filed: Sep. 15, 1987

[51] Int. Cl.$^4$ ............................................. H05B 31/26
[52] U.S. Cl. ........................... 315/111.21; 315/111.81; 315/111.71; 315/111.91
[58] Field of Search ............... 315/111.21, 111.81, 315/111.71, 111.91, 111.51; 204/192.32, 121, 146; 219/121.54, 121.57, 10.55 F

[56] References Cited

U.S. PATENT DOCUMENTS

| | | |
|---|---|---|
| 4,282,077 | 8/1981 | Reavill .......................... 204/192 E |
| 4,381,965 | 5/1983 | Maher, Jr. et al. ............. 264/192 E |
| 4,446,560 | 5/1984 | Gabor ................................ 373/25 |
| 4,724,296 | 2/1988 | Morley ......................... 219/121 PT |

Primary Examiner—Leo H. Boudreau
Assistant Examiner—Michael Razavi
Attorney, Agent, or Firm—Rosenblum, Parish & Bacigalupi

[57] ABSTRACT

A multiple electrode plasma reactor power circuit that utilizes a power splitting device, such as a center-tapped coil, to deliver balanced power to a plurality of powered electrodes. Balanced plasmas are thereby created between powered electrodes and grounded electrodes. In a preferred embodiment a plurality of center-tapped coils are connected to deliver balanced power to several powered electrodes located in a plurality of reactor chambers.

12 Claims, 3 Drawing Sheets

MULTIPLE ELECTRODE PLASMA REACTOR POWER DISTRIBUTION SYSTEM

BACKGROUND OF THE INVENTION

1. Field of the Invention

This present invention relates generally to electrical circuitry for gas plasma systems for the surface modification of a workpiece and more particularly to circuitry for multiple electrode gas plasma reactors.

2. Description of Prior Art

Gas plasma modification of surfaces has been found to be quite useful for a multitude of applications crossing many fields. These surface modifications include, but are not limited to, etching (metals, dielectrics, polymers, etc.), deposition (metals, dielectrics, polymers, etc.), etchback and desmear of printed circuit boards, and chemical surface treatment (including cleaning). A common problem which is encountered in plasma processing is the difficulty of obtaining uniform process results across the reactor. This problem is particularly evident in reactors which have multiple process areas utilizing a plurality of electrodes as was demonstrated by James W. Wilson, *Plasma Etching of Organic Materials in Large Multicell Reactors,* Electrochemical Society Extended Abstracts, 84-2, Abstract No. 369, Page 521, 1984 in a reactor used to desmear and etchback printed circuit boards.

One cause of this phenomena is the difference in impedance in each of the electrical feeds to the driven electrodes brought about by having electrode feeds which are not identical or symmetrical to each other. This results in a non-symmetrical distribution of power among the electrodes which manifests itself in a non-uniform plasma and thus non-uniform processing.

U.S. Pat. No. 4,381,965 illustrates a plasma etching reactor which has multiple pairs of electrodes which do not have symmetrical feeds. Each driven electrode receives the RF excitation by way of separate variable capacitances each in series with the input to the electrode plates. Uniform etching performance in each plasma region is achieved empirically by tuning each of the latter capacitances, determining the degree of etching occurring in each plasma region, re-adjusting the capacitances, observing the changes and continuing the testing and re-adjusting procedures until the etching effects are balanced. This process is lengthy and can be quite arduous. In addition, these settings are only true for a very narrow range of process parameters (power, pressure, gas utilized, load, etc.) and must be repeated when the parameters are changed significantly.

Another cause of non-uniform plasmas is the change in the electrical characteristics of the plasma due to loading effects, i.e., placement of multiple parts within a reactor. In U.S. Pat. No. 4,282,077, which describes a plasma reactor (a multiple electrode system) used for desmear and etch-back of printed circuit boards, this problem was overcome by utilizing variable inductances in series with each of the electrodes. Again uniformity is only obtained emperically using a lengthy and arduous procedure of tuning individual inductors that is similar to the one mentioned above in U.S. Pat. No. 4,381,965. In addition, the variable inductors are positioned within the reactor and thus exposed to the plasma conditions where they are subject to the atmospheric permeability variation as the plasma's electrical characteristics are changed. This feature makes a wide pressure use at a single setting difficult if not impossible to achieve. The gas chemistry and the process conditions which affect the electrical characteristics of the plasma also contribute to this variability.

Another example of a multiple electrode system is demonstrated by U.S. Pat. No. 4,474,659 where the workpieces themselves are acting as electrodes and multiple generators are used to obtain good uniformity. In this case, however, the goal is not to achieve electrical equality among the electrodes, but to vary the RF excitation power to each individual electrode to compensate for differences in gas composition and flow between various electrodes. In this patent is also disclosed a planar type electrode arrangement which is composed of multiple areas driven by different generators or by a single generator with attenuation of the individual feeds to the different areas of the electrode.

SUMMARY OF THE INVENTION

It is an object of the present invention to provide a new and improved apparatus for plasma processing for the surface modification of workpieces whether it be by etching, deposition or some other means of surface treatment, in an ionized gas plasma in a multiple-electrode environment.

It is another object of the present invention to provide a multiple electrode plasma reactor which permits the uniform processing of workpieces independent of the loading.

It is a further object of the present invention to provide a multiple electrode plasma reactor circuit which distributes the power evenly to each of the electrodes providing uniform plasma processing characteristics across the reactor.

It is yet another object of the present invention to provide a multiple electrode plasma reactor circuit which eliminates the necessity for tuning individual circuit elements in order to obtain uniform process results.

It is yet a further object of the present invention to provide a multiple electrode plasma reactor circuit which eliminates the need for multiple generators and/or multiple matching networks.

It is still another object of the present invention to provide a multiple electrode plasma reactor circuit which eliminates tuning devices and replaces them with a single component which does not require tuning.

It is still a further object of the present invention to provide a multiple electrode plasma reactor circuit which provides power to electrodes located in two different chambers and creates uniform plasmas within said chambers and which does not require tuning of the individual chambers relative to each other.

The present invention comprises electrical circuitry which creates uniform plasma characteristics in multiple electrode plasma reactors. It utilizes an electrical power-splitting element in the circuitry which provides power to the powered electrodes and minimizes the effect of the differing impedances of the power circuits and chamber characteristics. Such power-splitting elements as a differential drive transformer and/or a center-tapped coil are utilized, and the requirement in the prior art for tuning the power circuit elements is obviated.

It is an advantage of the present invention that it provides a new and improved apparatus for plasma processing for the surface modification of workpieces whether it be by etching, deposition or some other means of surface treatment, in an ionized gas plasma in a multiple-electrode environment.

It is another advantage of the present invention that it provides a multiple electrode plasma reactor which permits the uniform processing of workpieces independent of the loading.

It is a further advantage of the present invention that it provides a multiple electrode plasma reactor circuit which distributes the power evenly to each of the electrodes providing uniform plasma processing characteristics across the reactor.

It is yet another advantage of the present invention that it provides a multiple electrode plasma reactor circuit which eliminates the necessity for tuning individual circuit elements in order to obtain uniform process results.

It is yet a further advantage of the present invention that it provides a multiple electrode plasma reactor circuit which eliminates multiple generators and/or multiple matching networks.

It is still another advantage of the present invention that it provides a multiple electrode plasma reactor circuit which eliminates tuning devices and replaces them with a single component which does not require tuning.

It is still a further advantage of the present invention that it provides a multiple electrode plasma reactor circuit which provides power to electrodes located in two different chambers and creates uniform plasmas within said chambers and which does not require tuning of the individual chambers relative to each other.

These and other objects and advantages of the present invention will become apparent to one skilled in the art from consideration of the drawings and ensuing description of the preferred embodiments.

IN THE DRAWING

DESCRIPTION OF THE PREFERRED EMBODIMENT

Plasma chambers driven at frequencies of less than 100 MHz usually contain an electrode driven by the power generator and a grounded return path. Between the powered electrode and the ground electrode is a space in which the AC discharge takes place. The problem to be addressed is the optimal delivery of high frequency energy from a generator of fixed output impedance to a load which typically has other than optimal impedance. In prior art single electrode plasma chambers this is accomplished through the use of the usual L type reactive matching network, usually transforming the resistive nature of a plasma in series with the sheath capacitance near the electrode, to a 50 ohm source. A typical circuit diagram representation of the L type reactive matching network is presented in FIG. 1.

Figure 1:
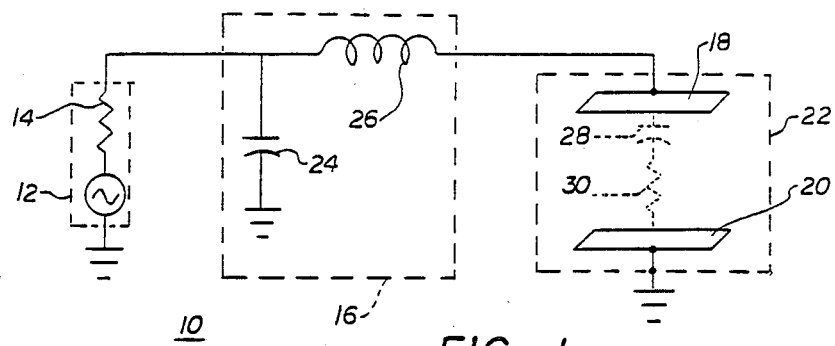
FIG. 1 is an electrical circuit diagram depicting a prior art L type reactive matching network for a single electrode chamber.

As depicted in FIG. 1, an L type reactive matching network 10 for a single electrode chamber includes an RF generator 12 shown with a source impedance 14, which is typically 50 ohms, an L type matching network 16, and a single powered electrode 18 together with a single grounded electrode 20 within a chamber 22. The matching network 16 includes a capacitance 24 and an inductance 26. When activated, the single powered electrode chamber 22 may be electrically represented as a capacitance 28, shown in phantom, and resistance 30, shown in phantom, which represent a simple model of the capacitance of the plasma sheath Faraday space and the resistance of the plasma. The operation and dynamics of this circuit representation are known in the prior art and well understood by the ordinarily skilled worker.

In a multiple electrode reactor arrangement symmetry is critical for achieving a uniform voltage profile along and between each electrode. Without good voltage distribution plasma uniformity becomes very poor often to the extent that different zones in the reactor will yield very difficult reactivities and the uniformity of plasma treatment will become unacceptable. As indicated hereinabove in U.S. Pat. Nos. 4,282,077 and 4,381,965, a problem with multiple electrode chambers has been that individual tuning of each of several inductors, or their equivalent capacitors, is required. The multiple electrode reactor thus proves to have special problems involving the impedance matching of multiple electrodes, having variable surface areas due to loading, and non-symmetrical RF feed lengths.

Figure 2:
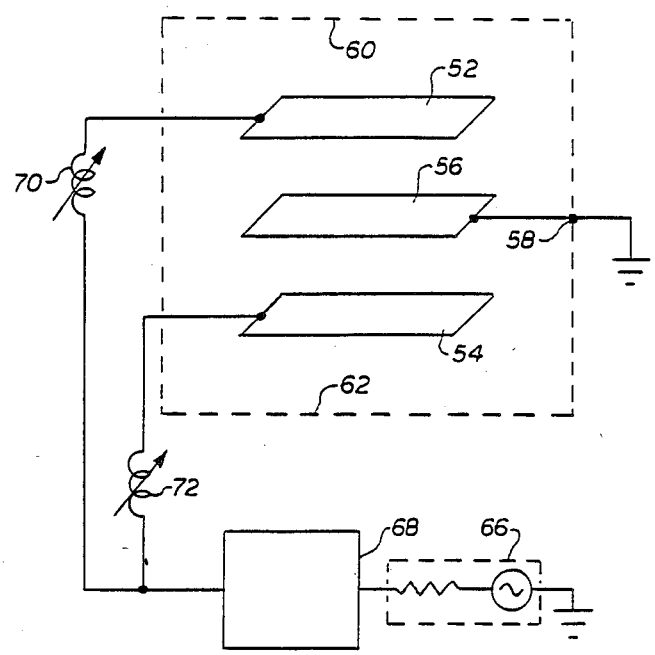
FIG. 2 is a circuit diagram for a prior art multiple electrode reactor.

A representative diagram of a typical prior art three-electrode reactor is presented in FIG. 2. As depicted therein the three-electrode reactor circuit diagram 50 includes a first powered electrode 52, a second powered electrode 54 and a grounded electrode 56 disposed between the powered electrodes 56 and 54 and within a grounded chamber 58. Two plasmas are created in the spaces between the grounded electrode 56 and the two powered electrodes 52 and 54. The grounded walls of the chamber 58, principally the upper wall 60 and lower wall 62 typically act as grounded electrodes relative to the powered electrodes 52 and 54 respectively, such that plasmas are also created between the powered electrodes 52 and 54 and the grounded walls 60 and 62 respectively. A generator 66 and a matching network 68 supply power to the two powered electrodes 52 and 54.

When materials to be treated in the plasma chamber are unevenly loaded onto the reactor shelves, the surface area and thus the capacitive coupling differs between the shelves of the chamber. This effect combined with the differences in feed line inductance produces two distinctly different load impedances between the multiple electrodes within the chamber. Two variable inductors, 70 and 72 enable the user to individually tune the two power circuits to the powered electrodes 52 and 54 respectively, such that the plasma fields generated between the two powered electrodes and the grounded surfaces will be uniform. Such uniformity is desired to obtain similar results on work pieces placed on different shelves within the chamber. The device depicted in FIG. 2 and described hereinabove is similar in operation to that described in U.S. Pat. No. 4,282,077. Of course, as described in U.S. Pat. No. 4,381,965, the two variable inductors 70 and 72 can be replaced by two variable capacitors (not shown) which also permit the individual tuning of the two powered circuits to obtain uniform results.

In a multiple electrode reactor arrangement symmetry is critical for achieving a uniform voltage profile along and between each electrode. Without good voltage distribution plasma uniformity becomes very poor often to the extent that different zones in the reactor will yield very different reactivities and the uniformity of plasma treatment will become unacceptable. As indicated hereinabove in U.S. Pat. Nos. 4,282,077 and 4,381,965, a problem with multiple electrode chambers has been that individual tuning of each of several inductors, or their equivalent capacitors, is required.

Figure 3:
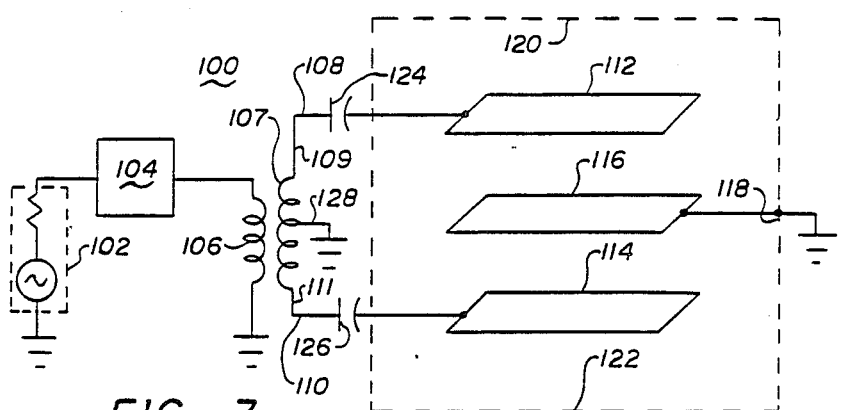
FIG. 3 is an electrical schematic of a first preferred embodiment of the present invention.

The present invention is a multiple electrode plasma reactor having a configuration and electrical circuitry which allows for improved power distribution and plasma uniformity without requiring perfectly symmetrical power feeds. In a preferred embodiment 100 of the present invention, as depicted in FIG. 3, the high frequency RF power from generator 102 is introduced into a matching network 104 in the normal fashion, however, upon exiting match network 104 the power is fed through a differential drive transformer 106. The power from the output coil 107 of the transformer is then split, whereby each end 109 and 111 of the output coil 107 of the transformer 106 is fed through separate feedthrough circuits 108 and 110 respectively to each of the powered electrodes 112 and 114 respectively disposed within the grounded chamber 118. The central electrode 116 in the chamber 118 is grounded, and the upper wall 120 and lower wall 122 of the grounded chamber 118 also act as grounded electrodes. To achieve uniformity, the electrodes are preferably formed as planar members and the spacing between the powered electrodes 112 and 114 and the grounded surfaces 116, 120 and 122 is equal throughout. Each RF power feedthrough circuit 108 and 110 may be provided with a DC blocking capacitor 124 and 126 respectively. The output coil 107 may have a grounded center tap 128, and alternatively, a single DC blocking capacitor (not shown) may be located in the grounded center tap. The blocking capacitors 124 and 126 are utilized to prevent self-bias drain of the powered electrodes. The effect of the differential drive transformer power circuit is to present to the matching network 104 one load impedance to be corrected. The differential drive transformer circuit applies virtually the same RF current to each powered electrode 112 and 114, balancing the discharge power evenly and creating uniform plasmas between the two powered electrodes 112 and 114 and the grounded surfaces 116, 120 and 122. The circuit configuration 100 therefore compensates for the variations caused by differing electrical feedthrough designs, shelf loading effects and other variables, and thus facilitates uniform plasmas in the processing areas of the reactor chamber.

Figure 4:
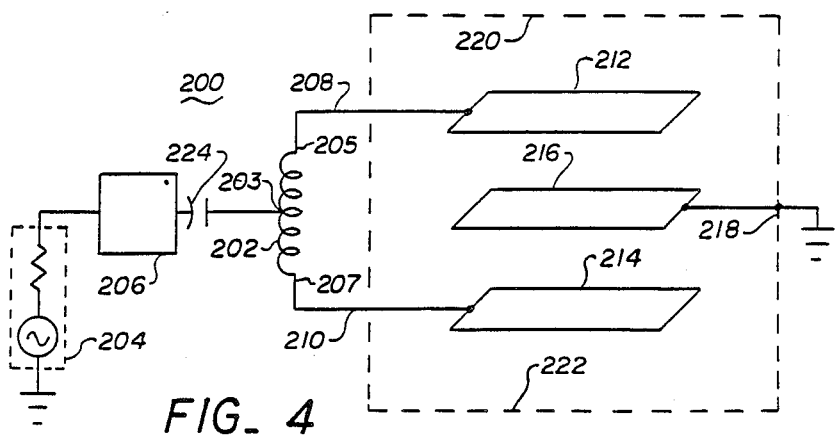
FIG. 4 is an electrical schematic diagram of another preferred embodiment of the present invention.

A second preferred embodiment 200 is depicted in FIG. 4. This embodiment includes the use of a single center-tapped coil 202 which replaces the differential drive transformer 106 and blocking capacitors 124 and 126, shown in FIG. 3. Thus, the electrical power is fed from the match network 206 through the center tap 203 of coil 202 and split, whereby power is fed through each end 205 and 207 of coil 202 and then through separate feedthrough circuits 208 and 210 respectively to each of the powered electrodes 212 and 214 respectively disposed within the grounded chamber 218. The central electrode 216 is grounded and the upper wall 220 and lower wall 222 of the grounded chamber 218 also function as grounded surfaces. The generator 204, match network 206 and chamber electrode configuration are similar to those depicted in FIG. 3. A DC blocking capacitor 224 may be located in the RF power line between the matching network 206 and the center-tapped coil 202.

The contribution of the center-tapped coil 202 to the power circuit is to tightly couple the powered electrodes 212 and 214 together. The center-tapped coil 202 thus in effect places the multiple electrodes in series in a tightly coupled fashion such that the matched network sees one load impedance presented to it. Any impedance imbalance between the two powered electrode circuits 208 and 210 will cause a differential current to flow through the coupled inductor 202. The net result is that the electrode power distribution system is self-balancing, even though different shelf loading configurations and other process parameters are utilized. Thus a uniform plasma is established in multiple plasma zones concurrently, and the uniform processing of workpieces, independent of the loading, is thus achieved.

Figure 5:
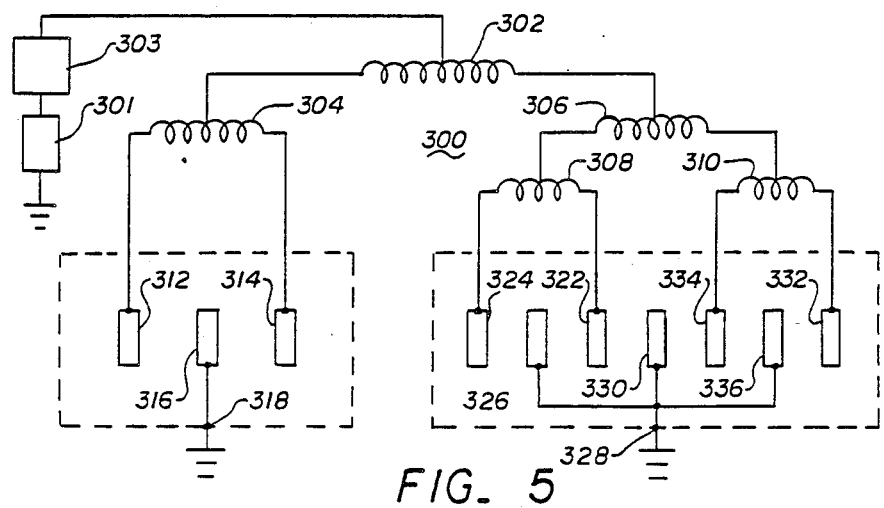
FIG. 5 is an electrical schematic of a further preferred embodiment of the present invention depicted in FIG. 4.

FIG. 5 depicts an extension of the preferred embodiments depicted in FIGS. 3 and 4 as applied to a plurality of electrodes in a plurality of chambers and/or zones within a chamber. The multiple electrode circuit 300 includes a plurality of reactive circuit elements, shown as center-tapped coils, which are configured to receive power from an RF generator 301 through a single matching network 303. The center-tapped coils could be replaced by differential drive transformers as is seen by comparing FIGS. 3 and 4 hereinabove. As depicted in FIG. 5, a center-tapped coil 302 delivers RF power to the center tap of two subsequent center-tapped coils 304 and 306 which feed power to two different chambers 318 and 328. Coil 306 thereafter delivers power to the center tap of two further center-tapped coils 308 and 310. Coil 304 delivers power to two powered electrodes 312 and 314 which create plasmas in association with grounded electrode 316 and the chamber walls within one chamber 318. In relation to the other chamber 328, coil 308 delivers power to powered electrodes 322 and 324 which create plasma fields in association with grounded electrodes 326 and 330 and the chamber wall of chamber 328, and coil 310 delivers power to two powered electrodes 332 and 334 which create plasma fields in relation to grounded electrodes 330 and 336 and the chamber wall of chamber 328. Plasma fields generated in association with coil 304 will be uniform. Likewise, assuming that shelf spacing and other parameters are equal, the plasma fields generated in relation to powered electrodes 322, 324, 332 and 334 from coils 308 and 310 within chamber 328 will all be uniform. However, owing to the further splitting of the power from coil 306 into coils 308 and 310, the plasma fields generated in association with coil 304 will have twice the power as the plasma fields associated with coils 308 and 310. Thus, the splitter coil concept may be utilized to create chambers having a plurality of powered electrodes interspersed with ground electrodes, wherein uniform plasmas will be created between the various powered and grounded surfaces.

Figure 6:
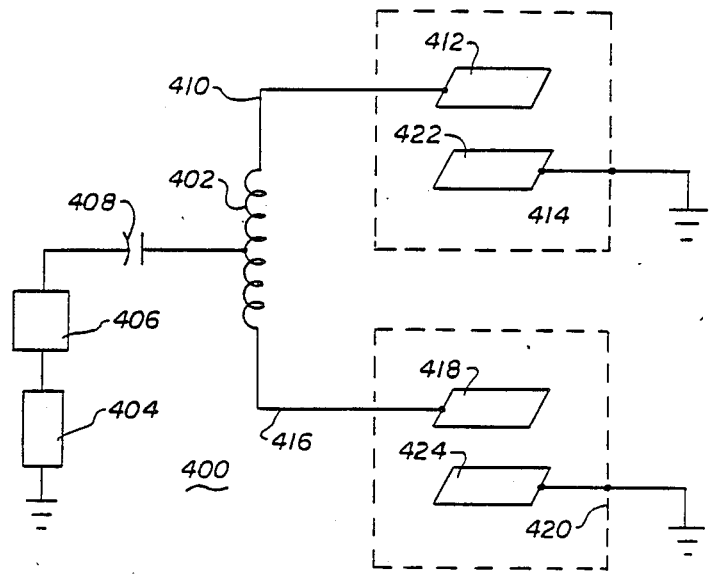
FIG. 6 is an electrical schematic of the present invention as applied to two single electrode chambers.

FIG. 6 is an electrical schematic of the present invention as applied to two single electrode chambers. As depicted in FIG. 6, the two-chamber circuit 400 includes a center-tapped coil 402 which receives RF power from an RF generator 404 through a matching network 406. A DC blocking capacitor 408 may be employed in the RF power line between the matching network 406 and the center tap of the coil 402. RF power from one output end 410 of coil 402 is provided to a powered electrode 412 disposed within a first reactor chamber 414. Output power from the other end 416 of coil 402 is supplied to a second powered electrode 418 which is disposed within a second reactor chamber 420. Grounded electrodes 422 and 424 may be disposed within the chambers 414 and 420 respectively, and the chamber walls of chambers 414 and 420 may likewise be grounded. It is therefore to be appreciated that the electrical circuit 400 permits two reactor chambers to be driven by a single RF generator 404 with a single matching network 406 in a electrical circuit that automatically adjusts for differing impedance loading within each chamber 414 and 420, such that uniform plasmas are created in both chambers. It is to be appreciated that the electrical circuit 400 of FIG. 6 and the electrical circuit concepts of FIG. 5 may be combined in various ways to provide RF power to a plurality of reactor chambers having at least one but perhaps several powered electrodes disposed within the various reactor chambers. The utilization of self-tuning circuit components, such as the differential drive transformers and/or center-tapped coils results in a self-tuning electrical circuit that provides for uniform plasmas among similarly powered electrodes.

Generally, the power-splitting concept of the present invention for creating plasmas in relation to a plurality of powered electrodes may be constructed where the number of powered electrodes is a number (N) which is equal to an integer greater than 1. The reactive circuit elements, such as 302, 304, 306, 308 and 310 of FIG. 5 may be either center-tapped coils or differential drive transformers, and the number of reactive circuit elements will be equal to the number (N) of powered electrodes minus one. Thus, a circuit of the type depicted in FIG. 5 may have a number (Y) of reactive circuit elements including a number (D) of differential drive transformers, a number (C) of center-tapped coils; where $Y = C + D$, and where $Y = N - 1$ and further where N is an integer greater than 1.

While the invention has been particularly shown and described with reference to certain preferred embodiments, it will be understood by those skilled in the art that various alterations and modifications in form and detail may be made therein. Accordingly it is intended that the following claims cover all such alterations and modifications as may fall within the true spirit and scope of the invention.

What I claim is:

1. A multiple electrode plasma reactor power circuit comprising:
    an RF generator;
    a matching network being electrically connected to said RF generator;
    at least one reaction chamber having a total of at least two powered electrodes disposed within said chambers and at least one grounded surface disposed in each said chamber, said powered electrodes and said grounded surfaces being positioned relative to each other such that at least one plasma for each powered electrode is created between said powered electrode and said grounded surface upon the application of RF power thereto;
    an electrode power circuit disposed between said matching network and said powered electrodes to feed RF power from said matching network to said powered electrodes, said electrode power circuit including a circuit means having an input power line connected from said matching network and having output power lines connected to said powered electrodes and operative to split said RF power among said powered electrodes; said circuit means supplying a voltage to each powered electrode that is in phase with the voltage supplied to each other powered electrode; said circuit means being automatically reactive to changes in the impedance between various ones of said powered electrodes and said grounded surfaces to alter the RF power applied to each said powered electrode to balance said plasmas generated between each said powered electrode and said ground surfaces.

2. A multiple electrode plasma reactor power circuit as described in claim 1 wherein said circuit means includes at least one center-tapped coil, each said center-tapped coil having two output ends, and wherein each said powered electrode is connected to an output end of a center-tapped coil; and wherein said matching network is connected to the center tap of a center-tapped coil.

3. A multiple electrode plasma reactor power circuit as described in claim 1 wherein two powered electrodes are disposed within one said chamber and one grounded electrode is disposed within said chamber between said two powered electrodes; and
    said circuit means includes a center-tapped coil having said input power line connected to the center tap of said coil, and said coil having two output lines wherein each said powered electrode is connected to one of said two output lines.

4. A multiple electrode plasma reactor power circuit as described in claim 1 wherein said circuit means includes a number (Y) of circuit elements including a number (D) of differential drive transformers and a number (C) of center-tapped coils, wherein the number (C) is at least one (1), and wherein $Y = D + C$ and wherein said chamber includes a number (N) of powered electrodes, wherein $Y = N - 1$, and wherein N is an integer greater than 1.

5. A multiple electrode plasma reactor comprising
    a chamber being defined by walls within which plasmas are created;
    a pluarlity of powered electrodes and at least one grounded surface being disposed within said chamber whereby said plasmas are struck between said powered electrodes and said grounded surface;
    said powered electrodes being connected to an RF power splitting circuit means, said circuit means being joined at an RF power input thereof to an RF power source;
    said circuit means supplying a voltage to each powered electrode that is in phase with the voltage supplied to each other powered electrode;
    said circuit means being automatically reactive to differing impedances between said powered electrodes and said grounded surface to alter the RF power supplied to each said powered electrode to balance the plasmas generated between each said powered electrode and said grounded surface.

6. A multiple electrode plasma reactor as described in claim 5 wherein a grounded electrode is disposed between each said powered electrode.

7. A multiple electrode plasma reactor as described in claim 6 wherein said powered electrodes and said grounded electrodes are formed as planar members and disposed within said chamber in a parallel relationship such that an equal distance exists between each said powered electrode and grounded electrode.

8. A multiple electrode plasma reactor as described in claim 7 wherein said circuit means includes a number (Y) of circuit elements including a number (D) of differential drive transformers and a number (C) of center-tapped coils, wherein the number (C) is at least one (1), and wherein $Y = D + C$ and wherein said chamber includes a number (N) of powered electrodes, wherein $Y = N - 1$, and wherein N is an integer greater than 1.

9. A multiple electrode plasma reactor power circuit comprising:
   an RF generator;
   a matching network being electrically connected to said RF generator;
   two or more reaction chambers having at least one powered electrode disposed within each said chamber and at least one grounded surface disposed in each said chamber, said powered electrode and said grounded surface within each said chamber being positioned relative to each other such that at least one plasma for each powered electrode is created between said powered electrode and said grounded surface upon the application of RF power thereto;
   an electrode power circuit disposed between said matching network and each said powered electrode to feed RF power from said matching network to each said powered electrode, said electrode power circuit including a circuit means having an input power line connected from said matching network and having output power lines connected to each said powered electrode and operative to split said RF power among said powered electrodes, said circuit means supplying a voltage to each powered electrode that is in phase with the voltage supplied to each other powered electrode;
   said circuit means being automatically reactive to changes in the impedance between various ones of said powered electrodes and said grounded surfaces to alter the RF power applied to each said powered electrode to balance said plasmas generated between each said powered electrode and said grounded surface.

10. A multiple electrode plasma reactor power circuit as described in claim 9, including three or more powered electrodes;
   wherein said circuit means includes two or more circuit elements, each said circuit element having an input power line and two output power lines, and wherein an output power line of at least one said circuit element is connected to said input power line of another said circuit element.

11. A multiple electrode plasma reactor power circuit as described in claim 10, wherein said circuit elements include at least one center-tapped coil.

12. A multiple electrode plasma reactor power circuit as described in claim 10 wherein each said circuit element is a center-tapped coil.

* * * * *